US008732638B1

United States Patent
Fa et al.

(10) Patent No.: US 8,732,638 B1
(45) Date of Patent: May 20, 2014

(54) VERIFYING PROPER REPRESENTATION OF SEMICONDUCTOR DEVICE FINGERS

(71) Applicant: Oracle International Corporation, Redwood Shores, CA (US)

(72) Inventors: Binhuai Brian Fa, Cupertino, CA (US); Kuldeep Singh, Santa Clara, CA (US); Bruce M. K. Leong, Santa Clara, CA (US); Kong-Fai Woo, San Jose, CA (US); Robert E Mains, Morgan Hill, CA (US)

(73) Assignee: Oracle International Corporation, Redwood Shores, CA (US)

( * ) Notice: Subject to any disclaimer, the term of this patent is extended or adjusted under 35 U.S.C. 154(b) by 0 days.

(21) Appl. No.: 13/799,398

(22) Filed: Mar. 13, 2013

(51) Int. Cl.
   *G06F 17/50* (2006.01)

(52) U.S. Cl.
   USPC .......................................... 716/106

(58) Field of Classification Search
   USPC .................................. 716/100, 106
   See application file for complete search history.

(56) References Cited

U.S. PATENT DOCUMENTS

| 6,465,891 B2* | 10/2002 | Wang et al. ............ 257/773 |
| 7,139,990 B2* | 11/2006 | Singh et al. ............ 716/112 |
| 2002/0096788 A1* | 7/2002 | Wang et al. ............ 257/784 |
| 2005/0216873 A1* | 9/2005 | Singh et al. .............. 716/5 |

OTHER PUBLICATIONS

Cadence, "Skill Language User Guide", Product Version 06.10, Mar. 2003.
Mentor Graphics, "Calibre RVE Results Viewing Environment", Physical Verification Datasheet, www.mentor.com, Feb. 2010.

* cited by examiner

*Primary Examiner* — Suchin Parihar
(74) *Attorney, Agent, or Firm* — Miles & Stockbridge P.C.

(57) ABSTRACT

A system for verifying that device fingers of a semiconductor circuit have been properly represented by a corresponding layout diagram. The system determines a plurality of sub-circuits, from within a netlist of a schematic diagram, to be verified. Each sub-circuit of the plurality of sub-circuits includes a multi-finger device. The system also determines a first number of fingers included in the plurality of sub-circuits as represented by the schematic diagram. The system also determines a second number of fingers included in the plurality of sub-circuits as represented by the corresponding layout diagram. The system compares the first number of fingers against the second number of fingers. The system reports an error if the first number of fingers does not correspond to the second number of fingers.

18 Claims, 13 Drawing Sheets

503
.subckt vte_r_cclmt_pd38_leaf_pdv in0 in1 in2 pd_b pd_t pwr pwr_nw
......
mxm12 pd_b net10 pwr pwr_nw pch_mac l=30n w=3u nf=4 m=1 ⎯⎯ 510
mxm18 pd_t net10 pwr pwr_nw pch_mac l=30n w=3u nf=8 m=1 ⎯⎯ 511
.ends vte_r_cclmt_pd38_leaf_pdv 504
.subckt vte_r_cclmt_pd38_pdv
......
x6 index<1> index_n<0> index<2> pd_b<6> pd_t<6> pwr pwr_nw vte_r_cclmt_pd38_leaf_pdv
x2 index_n<0> index_n<1> index_n<2> pd_b<0> pd_t<0> pwr pwr_nw vte_r_cclmt_pd38_leaf_pdv
.ends vte_r_cclmt_pd38_pdv 505
.subckt vte_r_cclmt_pd38_x2_pdv
......
xp1 index1<0> index1<1> index1<2> index1_n<0> index1_n<1> index1_n<2> pd1_b<0> pd1_b<1>
pd1_b<2> pd1_b<3> pd1_b<4> pd1_b<5>
+pd1_b<6> pd1_t<7> pd1_t<0> pd1_t<1> pd1_t<2> pd1_t<3> pd1_t<4> pd1_t<5> pd1_t<6> pd1_t<7>
pwr pwr_nw vte_r_cclmt_pd38_pdv
xp0 index0<0> index0<1> index0<2> index0_n<0> index0_n<1> index0_n<2> pd0_b<0> pd0_b<1>
pd0_b<2> pd0_b<3> pd0_b<4> pd0_b<5>
+pd0_b<6> pd0_b<7> pd0_t<0> pd0_t<1> pd0_t<2> pd0_t<3> pd0_t<4> pd0_t<5> pd0_t<6> pd0_t<7>
pwr pwr_nw vte_r_cclmt_pd38_pdv
.ends vte_r_cclmt_pd38_x2_pdv

Fig. 5

.model pch_mac pmos

.model nch_mac nmos

...

.sub-circuit snand2 a b y nl=40n nw=0 nfingers=1 pl=40n pw=0 pfingers=1 gbias=0 m=1

* port IN a

* port IN b

* port OUT y mxmmi1 y a inm0 vsb nch_new l='nl+(gbias/0.9)' w='nw*nfingers' nf='nfingers' m=1 mxmmi0 inm0 b vss vsb nch_new l='nl+(gbias/0.9)' w='nw*nfingers' nf='nfingers' m=1 mxmmi3 y b vdd vnw pch_new l='pl+(gbias/0.9)' w='pw*pfingers' nf='pfingers' m=1 mxmmi2 y a vdd vnw pch_new l='pl+(gbias/0.9)' w='pw*pfingers' nf='pfingers' m=1

.ends snand2

...

.sub-circuit cl_u1_aomux5_8x in0 in1 in2 in3 in4 out sel0 sel1 sel2 sel3 sel4

* port IN in0

* port IN in1

* port IN in2

* port IN in3

* port IN in4

* port IN sel0

* port IN sel1

* port IN sel2

* port IN sel3

* port IN sel4

* port OUT out x2 in4 sel4 net14 snand2 pw=1.21u nw=1.21u nfingers=2 pfingers=2 x0 in0 sel0 in1 sel1 net15 saoi22 pw=390.0n nw=1.21u x1 in2 sel2 in3 sel3 net20 saoi22 pw=390.0n nw=1.21u x4 net15 net20 net14 out snand3 pw=630.0n nw=900n .ends cl_u1_aomux5_8x

Fig. 6

.sub-circuit cl_u1_aomux5_8x in0 in1 in2 in3 in4 out sel0 sel1 sel2 sel3 sel4

Mx2/mxmmi3 net14 sel4 vdd vnw pch_new l=4e-08 m=1 nf=2 w=2.42e-06

Mx2/mxmmi2 net14 in4 vdd vnw pch_new l=4e-08 m=1 nf=2 w=2.42e-06

Mx0/mxmmi4 net15 sel1 x0/net29 vnw pch_new l=4e-08 m=1 w=3.9e-07

Mx0/mxmmi3 x0/net29 sel0 vdd vnw pch_new l=4e-08 m=1 w=3.9e-07

Mx0/mxmmi2 net15 in1 x0/net29 vnw pch_new l=4e-08 m=1 w=3.9e-07

Mx0/mxmmi1 x0/net29 in0 vdd vnw pch_new l=4e-08 m=1 w=3.9e-07

Mx1/mxmmi4 net20 sel3 x1/net29 vnw pch_new l=4e-08 m=1 w=3.9e-07

Mx1/mxmmi3 x1/net29 sel2 vdd vnw pch_new l=4e-08 m=1 w=3.9e-07

Mx1/mxmmi2 net20 in3 x1/net29 vnw pch_new l=4e-08 m=1 w=3.9e-07

Mx1/mxmmi1 x1/net29 in2 vdd vnw pch_new l=4e-08 m=1 w=3.9e-07

Mx4/mxmmi5 out net14 vdd vnw pch_new l=4e-08 m=1 w=6.3e-07

Mx4/mxmmi4 out net20 vdd vnw pch_new l=4e-08 m=1 w=6.3e-07

Mx4/mxmmi3 out net15 vdd vnw pch_new l=4e-08 m=1 w=6.3e-07

Mx2/mxmmi1 net14 in4 x2/inm0 vsb nch_new l=4e-08 m=1 nf=2 w=2.42e-06

Mx2/mxmmi0 x2/inm0 sel4 vss vsb nch_new l=4e-08 m=1 nf=2 w=2.42e-06

Fig. 7

ECHO

CONTEXT cl_u1_aomux5_8x

DEVICE LAYOUT x2/mxmmi3

DEVICE LAYOUT x2/mxmmi2

DEVICE LAYOUT x2/mxmmi1

DEVICE LAYOUT x2/mxmmi0

CONTEXT cl_u1_aomux5_8x

PLACEMENTS OF snand2 FLAT

Fig. 8

ECHO

OK: Echo is ON

CONTEXT mf_3hier_m2_nf2

OK: Query cell: mf_3hier_m2_nf2

DEVICE LAYOUT x2/mxmmi3

OK: M48 M51

DEVICE LAYOUT x2/mxmmi2

OK: M49 M50

DEVICE LAYOUT x2/mxmmi1

OK: M30 M29

DEVICE LAYOUT x2/mxmmi0

OK: M31 M28

OK: Terminating.

......

x2/mxmmi3 M48 M51 (layout has two fingers)

x2/mxmmi2 M49 M50 (layout has two fingers)

x2/mxmmi1 M30 M29 (layout has two fingers)

x2/mxmmi0 M31 M28 (layout has two fingers)

Fig. 9

(runAndParseCalibreQuery2{ } )

…...

ECHO

OK: Echo is ON

CONTEXT cl_u1_aomux5_8x X1

OK: Query cell: snand2

DEVICE INFO M48 device info M48

Device_Info 1000

Info:

0 0 7 Feb 17 18:04:24 2010

178 sel4 vdd

4 vnw 6.05e-07

4e-08 pgate_mac 1 1 0 Feb 17 18:04:24 2010 p 1 4

1520 5740

2125 5740

2125 5780

1520 5780

END OF RESPONSE 0 0 0 Feb 17 18:04:24 2010

…...

Fig. 10 mf_3hier_m2_nf2=x1/x0/mxm2 2 2 1.885 1.085 1.885 1.215 1.885 1.455 1.885 1.585 mf_3hier_m2_nf2=x0/mxm2 2 2 1.995 4.985 1.995 5.115 1.995 5.355 1.995 5.485 mf_3hier_m2_nf2=mxm2 2 2 2.935 6.605 2.935 6.735 2.935 6.975 2.935 7.105 mf_3hier_m2_nf2=x1/x0/mxm3 2 2 2.84 1.085 2.84 1.215 2.84 1.455 2.84 1.585 mf_3hier_m2_nf2=x0/mxm3 2 2 2.95 4.985 2.95 5.115 2.95 5.355 2.95 5.485

Fig. 11

VERIFYING PROPER REPRESENTATION OF SEMICONDUCTOR DEVICE FINGERS

FIELD

One embodiment is directed generally to a computer system, and in particular to a computer system that verifies that device fingers of a semiconductor circuit, as described by a schematic diagram, have been properly represented by a corresponding layout diagram.

BACKGROUND INFORMATION

A semiconductor circuit may be described by a schematic diagram that represents components of the circuit using abstract symbols. The schematic diagram may show the components of the circuit as standardized symbols as opposed to realistic images. The schematic diagram of a circuit may have a corresponding layout diagram.

A layout that corresponds to a schematic diagram is meant to perform the same functionality as the schematic diagram. A layout may use different shapes and patterns to represent different metal, oxide, or other material layers that make up the components of the circuit, as also represented by the corresponding schematic diagram.

In order to ensure that a particular layout diagram properly represents a particular corresponding schematic diagram (e.g., will perform the same functionality as the particular schematic diagram), a user may perform a layout versus schematic ("LVS") verification process. The LVS process may compare the arrangement of represented components of the layout against the arrangement of represented components of the corresponding schematic diagram.

SUMMARY

One embodiment is a system for verifying that device fingers of a circuit have been properly represented by a corresponding layout diagram. The system determines a plurality of sub-circuits, from within a netlist of a schematic diagram, to be verified. Each sub-circuit of the plurality of sub-circuits includes a multi-finger device. The system also determines a first number of fingers included in the plurality of sub-circuits as represented by the schematic diagram. The system also determines a second number of fingers included in the plurality of sub-circuits as represented by the corresponding layout diagram. The system compares the first number of fingers against the second number of fingers. The system reports an error if the first number of fingers does not correspond to the second number of fingers.

BRIEF DESCRIPTION OF THE DRAWINGS

FIG. 5 illustrates parameters within a netlist in accordance with one embodiment.

FIG. 6 illustrates another netlist in accordance with one embodiment.

FIG. 7 illustrates the netlist of FIG. 6 after a flattening process has been applied.

FIG. 8 illustrates an example query for retrieving requested layout information in accordance with one embodiment.

FIG. 9 illustrates data retrieved via the example query of FIG. 8.

FIG. 10 illustrates an example query for retrieving data relating to the shapes of device gates and seed layers in accordance with one embodiment.

FIG. 11 illustrates an example response file generated in response to the query of FIG. 10 in accordance with one embodiment.

DETAILED DESCRIPTION

One embodiment is a system for determining whether a layout diagram for a particular semiconductor circuit properly corresponds to a schematic diagram of the same particular circuit. Specifically, the system verifies that device fingers (of devices included in the particular circuit) described by the layout diagram accurately represents the device fingers of the corresponding schematic diagram. More specifically, the system verifies that a number of device fingers described by the layout diagram corresponds to the number of device fingers described by the corresponding schematic diagram.

Figure 1:
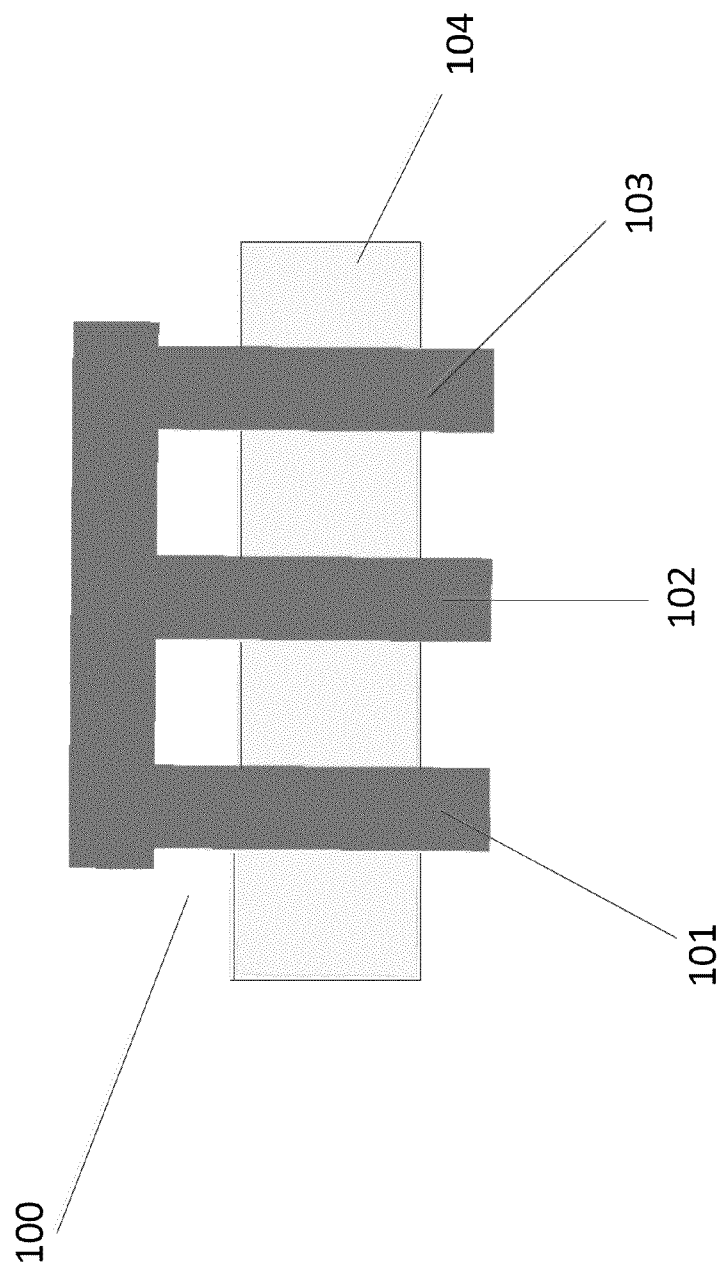
FIG. 1 illustrates a semiconductor device with multiple device fingers.

FIG. 1 illustrates a semiconductor device 100 with multiple device fingers 101, 102, and 103. Certain semiconductor devices (e.g., transistors) of a circuit may comprise multiple "device fingers." A device finger may be a portion of a semiconductor device that extends over a diffusion region 104 between a source and a drain and performs the function of a gate between the source and the drain. By splitting a single finger into multiple fingers to create a multi-finger device, the multi-finger device may, in certain scenarios, achieve improved performance over a single-finger-device counterpart. When a multi-finger device is described by a schematic diagram, a user may wish to confirm that a corresponding layout diagram (to the schematic diagram) properly represents the device fingers of the multi-finger device. Such confirmation may be important because, when designing a circuit at a sub-micron level (e.g., designing 28 nm projects), a difference between the number of device fingers in the layout diagram and the schematic diagram may result in undesirable performance by the circuit.

Previous methods for performing LVS verification have not been able to verify that device fingers described in a layout diagram properly represent device fingers described in a corresponding schematic diagram. The previous methods for performing LVS verification such as methods using Calibre™ ("Calibre"), from Mentor Graphics Corp., have thus generally not been able to verify that a number of device fingers described by a layout diagram correspond to the number of device fingers described by the corresponding schematic diagram.

In contrast with the previous methods, one difference between an embodiment of the present system for determining whether a layout diagram for a particular circuit properly represents a corresponding schematic diagram for the same particular circuit is that, in the present system, verification that a number of device fingers described by the layout diagram corresponds to a number of fingers described by the schematic diagram may be performed.

Figure 2:
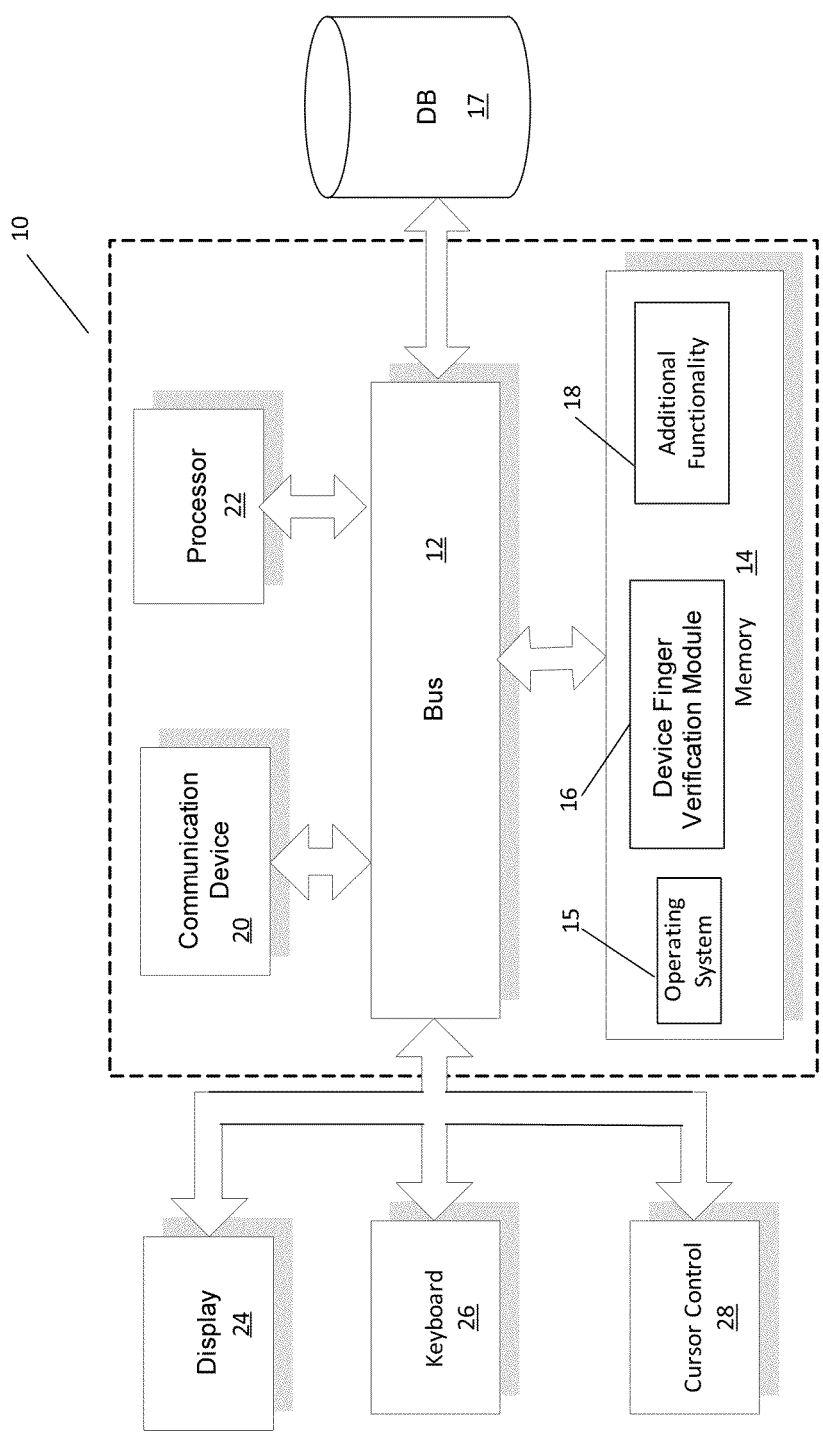
FIG. 2 is an overview block diagram of a computer system for verifying that device fingers of a semiconductor circuit have been properly represented in accordance with an embodiment of the present invention.

FIG. 2 is an overview block diagram of a computer system 10 for verifying that device fingers of a semiconductor circuit have been properly represented in accordance with an embodiment of the present invention. Although shown as a single system, the functionality of system 10 can be implemented as a distributed system. System 10 includes a bus 12 or other communication mechanism for communicating information, and a processor 22 coupled to bus 12 for processing information. Processor 22 may be any type of general or specific purpose processor. System 10 further includes a memory 14 for storing information and instructions to be executed by processor 22. Memory 14 can be comprised of any combination of random access memory ("RAM"), read only memory ("ROM"), static storage such as a magnetic or optical disk, or any other type of computer readable media. System 10 further includes a communication device 20, such as a network interface card, to provide access to a network. Therefore, a user may interface with system 10 directly, or remotely through a network or any other known method.

Computer readable media may be any available media that can be accessed by processor 22 and includes both volatile and nonvolatile media, removable and non-removable media, and communication media. Communication media may include computer readable instructions, data structures, program modules or other data in a modulated data signal such as a carrier wave or other transport mechanism and includes any information delivery media.

Processor 22 may be further coupled via bus 12 to a display 24, such as a Liquid Crystal Display ("LCD"). A keyboard 26 and a cursor control device 28, such as a computer mouse, may be further coupled to bus 12 to enable a user to interface with system 10.

In one embodiment, memory 14 stores software modules that provide functionality when executed by processor 22. The modules include an operating system 15 that provides operating system functionality for system 10. The modules further include device finger verification module 16 for a system for verifying that device fingers of a semiconductor circuit have been properly represented, as disclosed in more detail below. System 10 can be part of a larger system, such as a test bed system. Therefore, system 10 will typically include one or more additional functional modules 18 to include additional functionality, such as data processing functionality for retrieving schematics, layouts, device models, etc. One embodiment is implemented in conjunction with Calibre, and so the Calibre functionality can be in module 18 or be remote from system 10. A database 17 is coupled to bus 12 to store data used with modules 16 and 18.

In one embodiment, a schematic of a circuit may describe the arrangement of its components/devices and the interconnections between by using a netlist. Netlists may be stored as a specific file format (such as an .slvs file) depending on the specific program used to create the schematic. A netlist may be parsed to analyze the components/devices and interconnections described therein. Once a netlist is parsed, the parameters used by the netlist to define the circuit may be analyzed. For example, one possible parameter used by a netlist (i.e., a SPICE™ netlist) is the "nf" parameter. The "nf" parameter may define a number of device fingers of a specific device within the netlist. Another possible parameter used by a netlist is the "m" parameter. The "m" parameter may define a number of instances/copies of a particular device.

Figure 3:
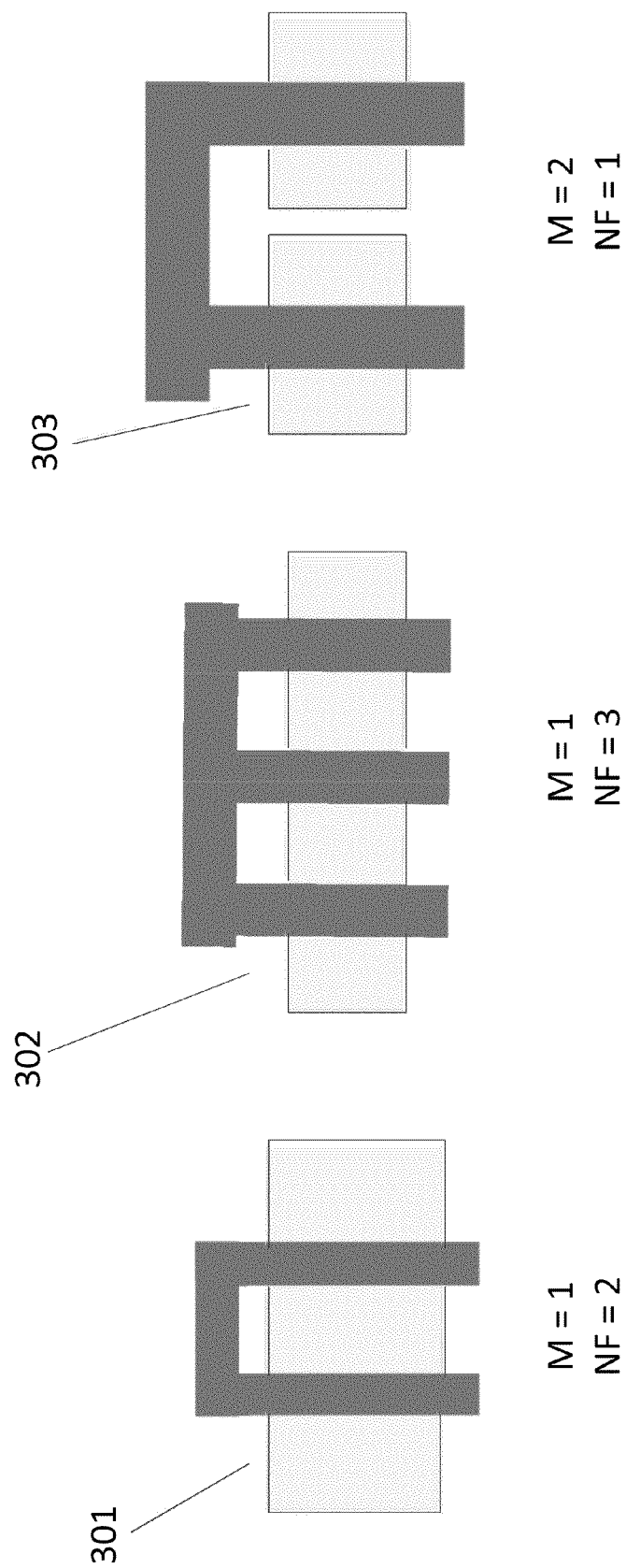
FIG. 3 illustrates sub-circuits with different netlist parameters.

FIG. 3 illustrates sub-circuits with different netlist parameters. Sub-circuit 301 includes one instance (i.e., m=1) of a device with two device fingers (i.e., nf=2). Sub-circuit 302 includes one instance (i.e., m=1) of a device with three device fingers (i.e., nf=3). Sub-circuit 303 includes two instances (i.e., m=2) of a device with one device finger (i.e., nf=1).

In one embodiment, a program such as dFlattener™ may be used to process a netlist so that the components/devices and interconnections therein are described from the perspective of a single logical level, and do not appear in a hierarchical format with multiple logical levels.

Embodiments may parse a netlist file, describing a circuit, in order to determine a specified plurality of sub-circuits, contained by the circuit, that are to be checked/verified. In one embodiment, the specified plurality is a minimum list of sub-circuits to be checked/verified. Checking/verifying a sub-circuit within the plurality of sub-circuits includes verifying that the layouts of the sub-circuits accurately represent the schematics of the sub-circuits. In one embodiment, a sub-circuit is determined to be one of the sub-circuits of the minimum list of sub-circuits if the sub-circuit: (1) includes at least one device with an "nf" parameter set to a value greater than one, or (2) references an instantiation of at least one sub-circuit that includes an "nf" parameter set to a value that is greater than one.

After a minimum list of sub-circuits is determined, embodiments perform the checking/verification process for each listed sub-circuit. Because the entire circuit, containing the listed sub-circuits, may be large, it may be difficult to effectively check the entire circuit in a timely manner. As such, by checking the sub-circuits of a circuit, as opposed to the entire circuit itself, embodiments may more efficiently compare device fingers described by a layout to device fingers described by a schematic. In other words, by checking a subset that is less than the entire circuit, embodiments may more efficiently compare device fingers described by a layout to device fingers described by a schematic.

Although there may be many instances (i.e., "instantiations") of a given sub-circuit that includes at least one device with an "nf" parameter, embodiments will not check all instantiations of this given sub-circuit. Embodiments will check only one instantiation of this given sub-circuit. Because only one instance is checked, these embodiments may allow for improved performance by more efficiently checking through many different sub-circuits.

As such, embodiments generate a minimum list of sub-circuits that will include all devices with an "nf" parameter, and only these sub-circuits are checked. In order to check a minimum list of sub-circuits, embodiments ensure that there is no sub-circuit in the minimum list that is itself referred to by another sub-circuit in the list. Embodiments also allow a user to designate exceptions for checking/verifying sub-circuits. Specifically, embodiments allow a user to determine that a designated sub-circuit does not need to be checked/verified.

Once a list of sub-circuits to be checked/verified is determined, a two-phase checking process may be performed to verify that device fingers, of devices included in a particular circuit, described by a layout diagram accurately represent device fingers of a corresponding schematic diagram. In the first-phase of the two-phase checking process, a total number of fingers as described by a netlist is compared against a total number of fingers as described by the corresponding layout. Although a total number of fingers described by a netlist may correspond to a total number of fingers described by a layout, the number of fingers of each device of the netlist may not correspond to the number of fingers of each device of the corresponding layout.

Figure 4A:
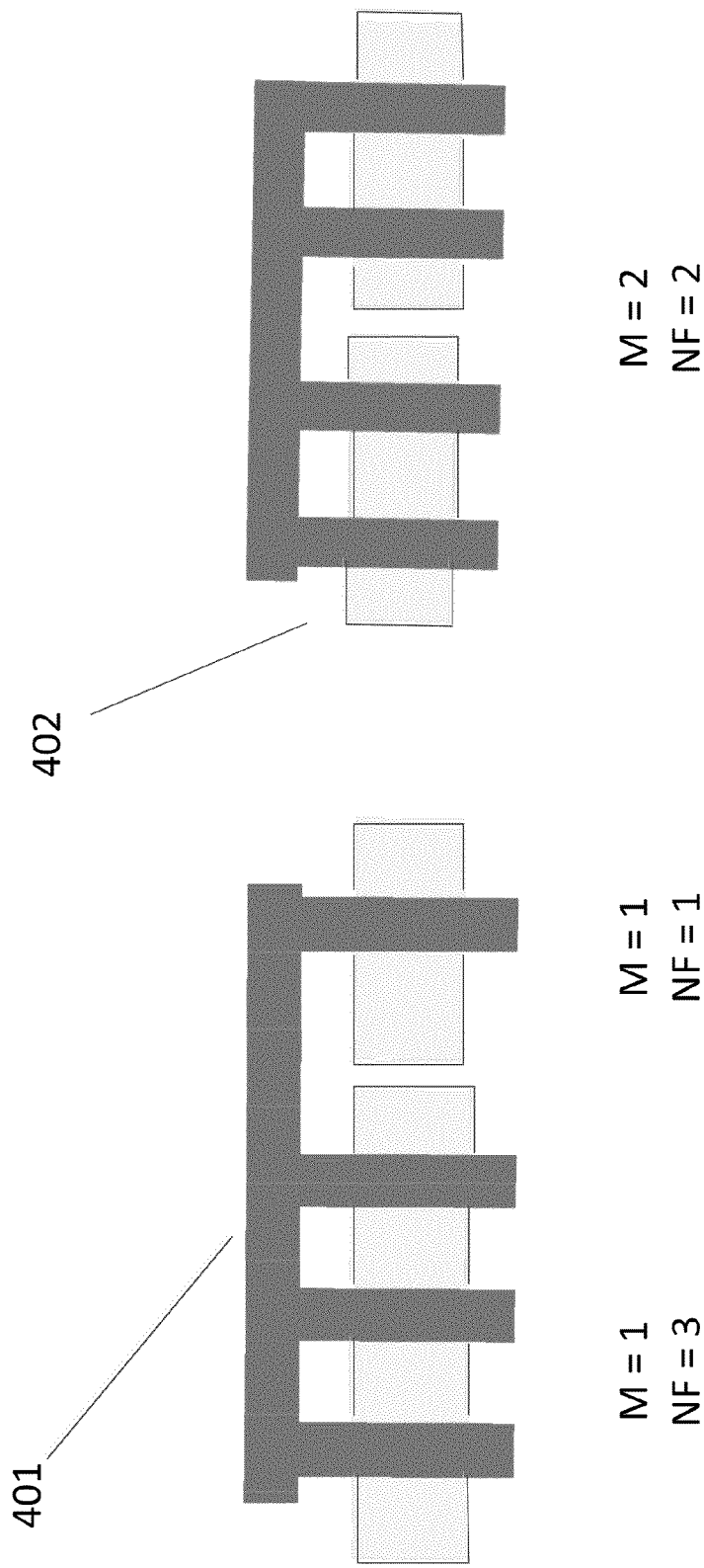
FIG. 4(a) illustrates two sub-circuits that have the same total number of device fingers but have different device finger parameters.

FIG. 4(a) illustrates two sub-circuits that have the same total number of device fingers but have different device finger parameters. Sub-circuits 401 and 402 both include four total device fingers. However, sub-circuit 401 includes devices with different "nf" and "m" values compared to the devices of sub-circuit 402.

Therefore, even if a total number of fingers described by a netlist may correspond to a total number of fingers described by a layout, the number of fingers of each device of the netlist may not correspond to the number of fingers of each device of the corresponding layout. As such, a second-phase of the two-phase checking process may be performed to verify that the number of fingers described by each device of the layout corresponds to the number of fingers described by each device of the corresponding netlist.

After the first phase is performed, if the total number of fingers described by the netlist is different than the total number of fingers described by the layout, then the layout is already determined to not correspond to the schematic, and no further checking is needed. However, if the total number of fingers described by the netlist matches the total number of fingers described by the layout, then a second-phase of the two-phase checking process may be performed to verify that the number of fingers described by each device of the netlist corresponds to the number of fingers described by each device of the corresponding layout.

Figure 4B:
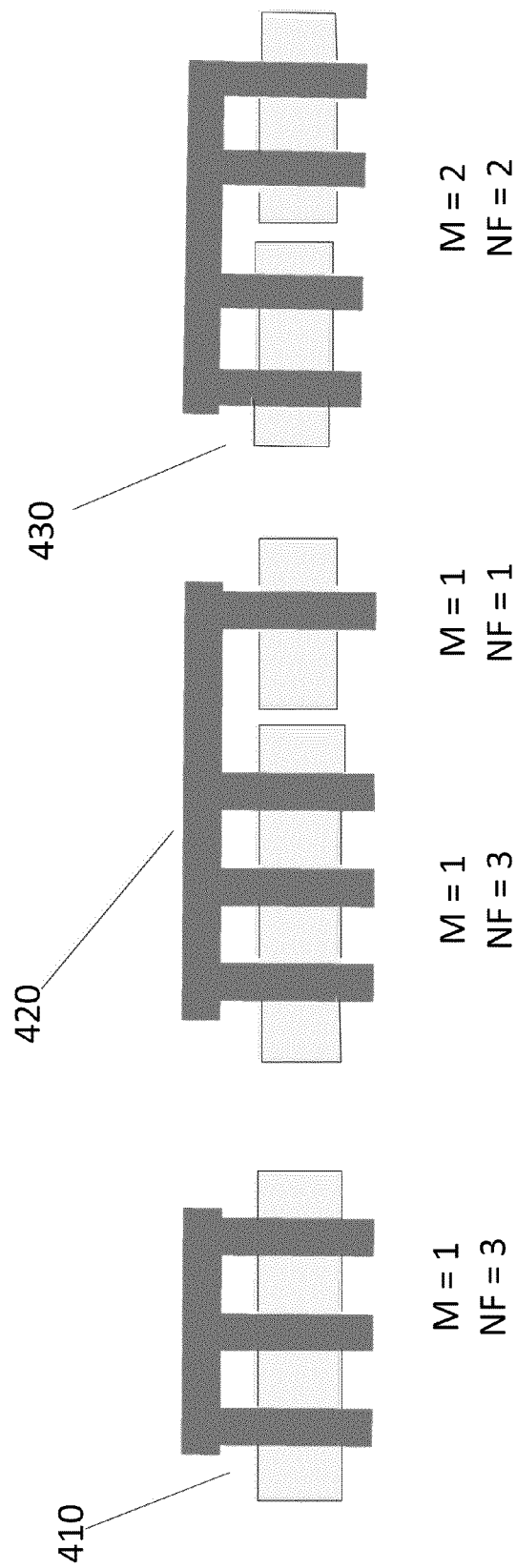
FIG. 4(b) illustrates a two-phase checking process in accordance with an embodiment of the present invention.

FIG. 4(b) illustrates a two-phase checking process in accordance with an embodiment of the present invention. As previously described above, a two-phase checking process may be performed to verify that device fingers described by a layout diagram accurately represent device fingers of a corresponding schematic diagram. For example, suppose that the two-phase checking process wishes to check whether a sub-circuit that is described in the schematic diagram as "m=2, nf=2" is accurately represented in a layout diagram by sub-circuits 410, 420, and 430. As described above, a first-phase checking is performed. The first phase can begin by calculating a total number of fingers for the sub-circuit described in the schematic diagram as being 4 total fingers (i.e., m×nf=2× 2=4). The first phase then compares the calculated total number of fingers (i.e., 4 fingers) against the total number of fingers for each of sub-circuits 410, 420, and 430, described in layout. Referring to FIG. 4(b), sub-circuit 410 has 3 total fingers (i.e., m×nf=1×3). Sub-circuit 420 has 4 total fingers (i.e., (1×3)+(1×1)=4). Sub-circuit 430 also has 4 total fingers (i.e., 2×2=4). Therefore, upon completion of the first phase, sub-circuit 410 would generate an error because the number of fingers for sub-circuit 410 (i.e., 3 fingers) does not match the number of fingers described in the schematic diagram (i.e., 4 fingers). However, each of sub-circuits 420 and 430 would pass the first phase of checking because each of sub-circuits 420 and 430 have the appropriate number of fingers (i.e., 4 fingers).

Therefore, after the first phase is performed, no additional checking is necessary for sub-circuit 410 because sub-circuit 410 has already failed the first phase by generating an error during the first phase. Second-phase checking can then be performed on sub-circuits 420 and 430 in order to perform the additional checking to verify that the device fingers of sub-circuits 420 and 430, in layout, accurately represent the device fingers of the corresponding schematic diagram. As described above, suppose the sub-circuit is described in the schematic diagram as "m=2, nf=2," corresponding to two instances of a device, with each instance having two fingers. The second phase of checking would then check each of sub-circuits 420 and 430 to verify that they each have two instances of a two-finger device. Referring again to FIG. 4(b), sub-circuit 420 comprises a first device with three fingers and a second device with one finger. Therefore, because sub-circuit 420 is not two instances of a two-finger device, sub-circuit 420 would generate an error and thus fail the second-phase checking. On the other hand, because sub-circuit 430 does comprise two instances of a two-finger device, sub-circuit 430 passes the second phase.

FIG. 5 illustrates parameters within a netlist in accordance with one embodiment. The netlist shown in FIG. 5 describes a circuit named "vte_r_cclmt_pd38_x2_pdv.slvs". In this example, the circuit includes three sub-circuits 503-505 (i.e., "subckt vte_r_cclmt_pd38_leaf_pdv," "subckt vte_r_cclmt_pd38_pdv," and "subckt vte_r_cclmt_ pd38_x2_ pdv." Each sub-circuit may include devices (e.g., "m×m12" 510 and "m×m18" 511).

As described above, embodiments determine the sub-circuits that include "nf" parameters. In this example, sub-circuit "vte_r_cclmt_pd38_leaf_pdv" 503 would be the only sub-circuit picked from among the sub-circuits of the .slvs file to be in the minimum list of sub-circuits because sub-circuit 503 is the only sub-circuit that has metal-oxide semiconductor ("MOS") devices with "nf" parameters (i.e., "nf=4" of device 510 and "nf=8" of device 511).

As shown in FIG. 5, the first line describing sub-circuit 504 (i.e., subckt vte_r_cclmt_pd38_pdv) contains a reference to sub-circuit 503 (i.e., vte_r_cclmt_pd38_leaf_pdv). Although a sub-circuit (e.g., sub-circuit 503) that is to be included in the minimum list of sub-circuits may be referenced a plurality of times by different sub-circuits, embodiments avoid checking all instances where the sub-circuit (e.g., sub-circuit 503) is referenced in order to avoid redundant checking of devices that occur within multiple sub-circuits. By avoiding circumstances of redundant checking, the checking/verifying process may be performed more quickly/efficiently.

FIG. 6 illustrates another netlist in accordance with one embodiment. As described above, embodiments may use dFlattener™ to flatten a netlist before applying the two-phase checking process. FIG. 6 illustrates a netlist that has not yet been flattened by dFlattener™.

FIG. 7 illustrates the netlist of FIG. 6 after a flattening process has been applied. Specifically, FIG. 7 illustrates the netlist of FIG. 6 after dFlattener™ has been applied. Referring to FIG. 7, a plurality of devices is described (i.e., devices "M×2/m×mmi3" to "Mx2/m×mmi0"). Of these described devices, 4 MOS devices include "nf" parameters: (1) M×2/ m×mmi3, (2) M×2/m×mmi2, (3) M×2/m×mmi1, and (4) M×2/m×mmi0.

Next, after the devices, as described by the schematic diagram, with "nf" parameters have been determined, a query is performed to retrieve layout information that corresponds to the devices. For example, embodiments that work in conjunction with Calibre may run a query on a Calibre Server to retrieve the requested layout information.

FIG. 8 illustrates an example query for retrieving requested layout information in accordance with one embodiment. Specifically, FIG. 8 illustrates a query of a Calibre Server for retrieving the four MOS devices that include "nf" parameters of FIG. 7 (i.e., M×2/m×mmi3, M×2/m×mmi2, M×2/m× mmi1, and M×2/m×mmi0).

FIG. 9 illustrates data retrieved via the example query of FIG. 8. Upon performing the query of Calibre Server of FIG. 8, data relating to each MOS device can be retrieved as shown in FIG. 9.

Embodiments may then perform the first-phase checking process as described above. Embodiments may perform first-phase checking by applying the "nf" and "m" parameters retrieved from the netlist of the schematic diagram. The "nf" and "m" parameters may have been previously determined and stored. Specifically, embodiments calculate "nf×m," and then the calculated value is compared against the number of fingers as determined from the retrieved layout information. As such, the first-phase checking determines whether a number of total fingers of a schematic, of a sub-circuit, match a number of total fingers of the corresponding layout.

In addition to performing a first-phase checking process, a second-phase checking process may also be performed. As described above, the second-phase checking process may be performed to verify that the number of fingers described by each device of the netlist corresponds to the number of fingers described by each device of the corresponding layout. Specifically, second-phase checking may verify that all fingers, as shown in the layout diagram, are grouped correctly within their respective oxide diffusion ("OD") regions. To perform second-phase checking, embodiments generate a query to retrieve data relating to the shapes of device gates and seed layers in layout. For example, a query script may be generated to query and retrieve device gate/seed layer shapes from a database. For example, a Calibre query script may be generated to query and retrieve device gate/seed layer shapes from a results database such as Calibre svdb.

For example, an example Calibre query script may be generated as described below:
ECHO
CONTEXT cl_u1_aomux5_8×X1
DEVICE INFO M48
DEVICE INFO M51
DEVICE INFO M49
DEVICE INFO M50

The data retrieved from Calibre svdb may then be used to check how device fingers in layout are grouped within their respective diffusion regions on the OD layer. For example, if a device has parameter "nf"=2 and parameter "m"=1, as defined by the netlist, two device fingers of the device should be drawn within a same diffusion region in layout. Otherwise, if two device fingers are not drawn within the same diffusion region in layout, a mismatch between the schematic representation and the corresponding layout representation is determined to have occurred.

FIG. 10 illustrates an example query for retrieving data relating to the shapes of device gates and seed layers in accordance with another embodiment. The example query is a Calibre query that is generated to retrieve layout device gate/seed layer data.

FIG. 11 illustrates an example response file generated in response to the query of FIG. 10 in accordance with one embodiment. In response to the query for retrieving data relating to the shapes of device gates and seed layers, a Calibre response file may be generated. This response file may be subsequently parsed to generate a layout-device-finger-grouping file. A Calibre response file may describe different devices in the following format 1.

Format 1: device name (x,y) (x,y) (x,y) (x,y)

Every pair of (x,y) above may represent a point on a gate-seed shape (i.e., a finger). Using the data relating to the shapes of device gates and seed layers, embodiments may verify that multiple devices (fingers) in the layout are correctly grouped within their respective diffusion regions on the OD layer. For example, if a sub-circuit has parameters "nf"=2 and "m"=2, embodiments check the layout to ensure that each device has two fingers grouped within each diffusion region, as shown by sub-circuit 402 of FIG. 4. If a sub-circuit has a parameter "m" that is greater than one, embodiments will compare the number of OD regions on the layout against the value of "m" to ensure that the number of OD regions corresponds to the value of "m."

Figure 12:
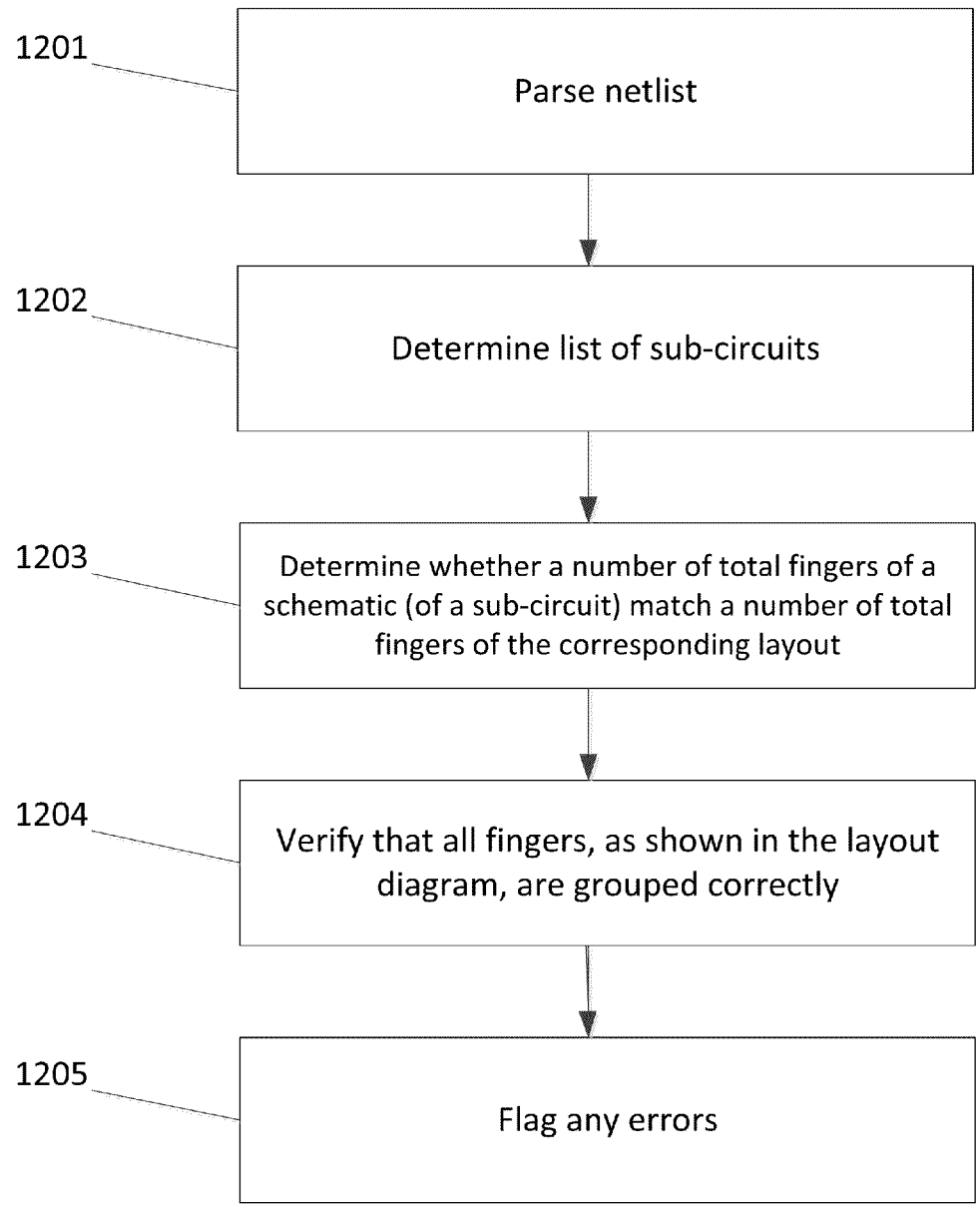
FIG. 12 is a flow diagram of the functionality of the device finger verification module of FIG. 2 in accordance with one embodiment.

FIG. 12 is a flow diagram of the functionality of the device finger verification module 16 of FIG. 2 in accordance with one embodiment. In one embodiment, the functionality of the flow diagram of FIG. 12 is implemented by software stored in memory or other computer readable or tangible medium, and executed by a processor. In other embodiments, the functionality may be performed by hardware (e.g., through the use of an application specific integrated circuit ("ASIC"), a programmable gate array ("PGA"), a field programmable gate array ("FPGA"), etc.), or any combination of hardware and software.

At 1201, a netlist of a semiconductor circuit is parsed to analyze the components/devices and interconnections described therein. Once the netlist is parsed, the parameters used by the netlist to define the circuit (e.g., parameter "nf" and parameter "m") may be analyzed.

At 1202, embodiments determine a list of sub-circuits, contained by the circuit, that are to be checked/verified. As described above, in one embodiment, a sub-circuit is determined to be one of the sub-circuits of the list of sub-circuits if the sub-circuit: (1) includes at least one device with an "nf" parameter set to a value greater than one, or (2) references at least one instantiation of a sub-circuit that includes a device with an "nf" parameter set to a value that is greater than one. In one embodiment, the list is a minimum list of sub-circuits that needs to be checked in order to check all multi-finger devices.

At 1203, embodiments perform a first-phase of a two-phase checking process. In the first-phase, a total number of fingers as described by a netlist is compared against a total number of fingers as described by the corresponding layout. Embodiments calculate "nf×m," and then the calculated value is compared against the number of fingers as determined from the layout. If the first-phase determines that the total number of fingers described by the netlist is different than the total number of fingers described by the layout, then the layout is determined to not correspond to the schematic, and no further checking is needed.

At 1204, embodiments perform a second-phase of the two-phase checking process. The second-phase may be performed to verify that the number of fingers described by each device of the netlist corresponds to the number of fingers described by each device of the corresponding layout. For example, embodiments verify that device fingers in layout are grouped within correct respective diffusion regions on the OD layer.

At 1205, embodiments flag errors that exist between the layout and the schematic that are determined by the first and second-phase checking.

As described above, embodiments are directed to a system that verifies that device fingers of a circuit, as described by a schematic diagram, have been properly represented in a corresponding layout diagram. Specifically, the system verifies that device fingers, of devices included in the particular circuit, described by the layout diagram accurately represent the device fingers of the corresponding schematic diagram. More specifically, the system verifies that a number of device fingers described by the layout diagram correspond to the number of device fingers described by the corresponding schematic diagram. By checking sub-circuits of a circuit, as opposed to the entire circuit itself, embodiments may more efficiently compare device fingers described by a layout to device fingers described by a schematic. In other words, by checking a subset less than the entire circuit, embodiments may more efficiently compare device fingers described by a layout to device fingers described by a schematic.

Several embodiments are specifically illustrated and/or described herein. However, it will be appreciated that modifications and variations of the disclosed embodiments are covered by the above teachings and within the purview of the appended claims without departing from the spirit and intended scope of the invention.

What is claimed is:

1. A non-transitory computer readable medium having instructions stored thereon that, when executed by a processor, causes the processor to verify that device fingers of a semiconductor circuit have been properly represented by a corresponding layout diagram, the verifying comprising:
   parsing a netlist file describing the circuit to determine a minimum list of a plurality of sub-circuits to be verified, wherein each sub-circuit of the plurality of sub-circuits includes one or more instances of a multi-finger device, and at least one sub-circuit comprises two or more multi-finger devices;
   wherein a sub-circuit is on the minimum list when it includes at least one device with an nf parameter set to a value greater than one, or references an instantiation of at least one sub-circuit that includes the nf parameter set to the value that is greater than one;
   determining a first total number of fingers included in the plurality of sub-circuits as represented by the schematic diagram;
   determining a second total number of fingers included in the plurality of sub-circuits as represented by the corresponding layout diagram;
   comparing the first total number of fingers against the second total number of fingers; and
   reporting an error when the first total number of fingers does not correspond to the second total number of fingers;
   when the first total number of fingers corresponds to the second total number of fingers, further determining, for each multi-finger device, whether a first number of device fingers for the multi-finger device as represented by the schematic diagram equals a second number of device fingers for the multi-finger device as represented by the corresponding layout diagram.

2. The computer readable medium of claim 1, the further determining comprising verifying that the device fingers of the plurality of sub-circuits are grouped within correct diffusion regions.

3. The computer readable medium of claim 1, wherein the minimum list of the plurality of sub-circuits comprises the minimum number of sub-circuits that need to be verified in order to verify all multi-finger devices.

4. The computer readable medium of claim 1, wherein the plurality of sub-circuits comprises a subset of the circuit, and the subset is less than the entire circuit.

5. The computer readable medium of claim 1, wherein determining the plurality of sub-circuits, from within the netlist of the schematic diagram, comprises determining sub-circuits with a parameter that defines a number of device fingers whose value is greater than one.

6. The computer readable medium of claim 1, wherein the verifying verifies only one instantiation of each of the plurality of the sub-circuits.

7. A method for verifying that device fingers of a semiconductor circuit have been properly represented by a corresponding layout diagram, the method comprising:
   parsing a netlist file describing the circuit to determine a minimum list of a plurality of sub-circuits to be verified, wherein each sub-circuit of the plurality of sub-circuits includes one or more instances of a multi-finger device, and at least one sub-circuit comprises two or more multi-finger devices;
   wherein a sub-circuit is on the minimum list when it includes at least one device with an nf parameter set to a value greater than one, or references an instantiation of at least one sub-circuit that includes the nf parameter set to the value that is greater than one;
   determining by the processor a first total number of fingers included in the plurality of sub-circuits as represented by the schematic diagram;
   determining by the processor a second total number of fingers included in the plurality of sub-circuits as represented by the corresponding layout diagram;
   comparing the first total number of fingers against the second total number of fingers; and
   reporting an error when the first total number of fingers does not correspond to the second total number of fingers;
   when the first total number of fingers corresponds to the second total number of fingers, further determining by the processor, for each multi-finger device, whether a first number of device fingers for the multi-finger device as represented by the schematic diagram equals a second number of device fingers for the multi-finger device as represented by the corresponding layout diagram.

8. The method of claim 7, the further determining comprising verifying that the device fingers of the plurality of sub-circuits are grouped within correct diffusion regions.

9. The method of claim 7, wherein the minimum list of the plurality of sub-circuits comprises the minimum number of sub-circuits that need to be verified in order to verify all multi-finger devices.

10. The method of claim 7, wherein the plurality of sub-circuits comprises a subset of the circuit, and the subset is less than the entire circuit.

11. The method of claim 7, wherein determining the plurality of sub-circuits, from within the netlist of the schematic diagram, comprises determining sub-circuits with a parameter that defines a number of device fingers whose value is greater than one.

12. The method of claim 7, wherein the verifying verifies only one instantiation of each of the plurality of the sub-circuits.

13. A system for verifying that device fingers of a semiconductor circuit have been properly represented by a corresponding layout diagram, the system comprising:
   a processor;
   a memory coupled to the processor;
   a sub-circuit determining module that parses a netlist file describing the circuit to determine a minimum list of a plurality of sub-circuits to be verified, wherein each sub-circuit of the plurality of sub-circuits includes one or more instances of a multi-finger device, and at least one sub-circuit comprises two or more multi-finger devices;
   wherein a sub-circuit is on the minimum list when it includes at least one device with an nf parameter set to a value greater than one, or references an instantiation of at least one sub-circuit that includes the nf parameter set to the value that is greater than one;
   a first determining module that determines a first total number of fingers included in the plurality of sub-circuits as represented by the schematic diagram;
   a second determining module that determines a second total number of fingers included in the plurality of sub-circuits as represented by the corresponding layout diagram;
   a comparing module that compares the first total number of fingers against the second number of fingers; and a reporting module that reports an error when the first number of fingers does not correspond to the second total number of fingers;

when the first total number of fingers corresponds to the second total number of fingers, further determining, for each multi-finger device, whether a first number of device fingers for the multi-finger device as represented by the schematic diagram equals a second number of device fingers for the multi-finger device as represented by the corresponding layout diagram.

14. The system of claim 13, the further determining comprising verifying that the device fingers of the plurality of sub-circuits are grouped within correct diffusion regions.

15. The system of claim 13, wherein the minimum list of the plurality of sub-circuits comprises the minimum number of sub-circuits that need to be verified in order to verify all multi-finger devices.

16. The system of claim 13, wherein the plurality of sub-circuits comprises a subset of the circuit, and the subset is less than the entire circuit.

17. The system of claim 13, wherein determining the plurality of sub-circuits, from within the netlist of the schematic diagram, comprises determining sub-circuits with a parameter that defines a number of device fingers whose value is greater than one.

18. The system of claim 13, wherein the verifying verifies only one instantiation of each of the plurality of the sub-circuits.

* * * * *

UNITED STATES PATENT AND TRADEMARK OFFICE
CERTIFICATE OF CORRECTION

| | | |
|---|---|---|
| PATENT NO. | : 8,732,638 B1 | Page 1 of 1 |
| APPLICATION NO. | : 13/799398 | |
| DATED | : May 20, 2014 | |
| INVENTOR(S) | : Fa et al. | |

It is certified that error appears in the above-identified patent and that said Letters Patent is hereby corrected as shown below:

In the Claims:

In column 9, line 6, in Claim 1, delete "causes" and insert -- cause --, therefor.

Signed and Sealed this
Seventh Day of October, 2014

Michelle K. Lee
*Deputy Director of the United States Patent and Trademark Office*